United States Patent [19]
Merry et al.

[11] Patent Number: 6,015,761
[45] Date of Patent: Jan. 18, 2000

[54] MICROWAVE-ACTIVATED ETCHING OF DIELECTRIC LAYERS

[75] Inventors: Walter Richardson Merry, Cupertino; William Brown; Harald Herchen, both of San Jose; Michael D. Welch, Livermore, all of Calif.

[73] Assignee: Applied Materials, Inc., Santa Clara, Calif.

[21] Appl. No.: 08/672,469

[22] Filed: Jun. 26, 1996

[51] Int. Cl.[7] .................................................. H01L 21/00
[52] U.S. Cl. .......................... 438/727; 438/723; 438/743; 216/69; 216/79; 156/345
[58] Field of Search ................................ 216/69, 70, 79; 438/723–725, 726, 728, 727, 743; 204/298.38, 298.37; 156/345 MW, 345 ME

[56] References Cited

U.S. PATENT DOCUMENTS

| | | | |
|---|---|---|---|
| 4,175,235 | 11/1979 | Niwa | 250/542 |
| 4,462,863 | 7/1984 | Nishimatsu et al. | 438/728 |
| 4,581,100 | 4/1986 | Hatzakis et al. | 156/643 |
| 4,673,456 | 6/1987 | Spencer et al. | 156/345 |
| 4,687,544 | 8/1987 | Bersin | 156/345 |
| 4,764,245 | 8/1988 | Grewal | 156/643 |
| 4,820,377 | 4/1989 | Davis et al. | 156/643 |
| 4,828,649 | 5/1989 | Davis et al. | 156/643 |
| 4,844,773 | 7/1989 | Loewenstein et al. | 156/643 |
| 4,851,630 | 7/1989 | Smith | 219/10.55 A |
| 4,855,016 | 8/1989 | Jucha et al. | 156/643 |
| 4,857,140 | 8/1989 | Loewenstein | 156/643 |
| 4,867,841 | 9/1989 | Loewnstein et al. | 156/643 |
| 4,878,994 | 11/1989 | Jucha et al. | 156/643 |
| 4,983,254 | 1/1991 | Fujimura et al. | 216/69 |
| 5,201,994 | 4/1993 | Nonaka et al. | 156/643 |
| 5,228,950 | 7/1993 | Webb et al. | 156/643 |
| 5,286,344 | 2/1994 | Blalock et al. | 156/657 |
| 5,326,427 | 7/1994 | Jerbic | 156/643 |
| 5,423,945 | 6/1995 | Marks et al. | 156/662.1 |
| 5,445,710 | 8/1995 | Hori et al. | 156/643.1 |

FOREIGN PATENT DOCUMENTS

3714144A1  12/1987  Germany.

*Primary Examiner*—William Powell
*Attorney, Agent, or Firm*—Ashok Janah

[57] ABSTRACT

A microwave-activated plasma process for etching dielectric layers (20) on a substrate (25) with excellent control of the shape and cross-sectional profile of the etched features (40), high etch rates, and good etching uniformity, is described. A process gas comprising (i) fluorocarbon gas (preferably $CF_4$), (ii) inorganic fluorinated gas (preferably $NF_3$), and (iii) oxygen, is used. The process gas is introduced into a plasma zone (55) remote from a process zone (60) and microwaves are coupled into the plasma zone (55) to form a microwave-activated plasma. The microwave-activated plasma is introduced into the process zone (60) to etch the dielectric layer (20) on the substrate (25) with excellent control of the shape of the etched features.

37 Claims, 3 Drawing Sheets

MICROWAVE-ACTIVATED ETCHING OF DIELECTRIC LAYERS

BACKGROUND

The present invention relates to a process for etching substrates, and in particular, for etching dielectric layers on semiconductor substrates.

In integrated circuit fabrication, it is often desirable to etch features in an electrically insulative dielectric layer 10 on a substrate 11, as schematically illustrated in FIG. 1a. The dielectric layers 10 include for example, silicon dioxide, undoped silicate glass, phosphosilicate glass (PSG), borophosphosilicate glass (BPSG), $Si_3N_4$, and silicon dioxide glass deposited from tetraethylorthosilane (TEOS). The dielectric layers 10 are typically used to electrically isolate devices formed on a semiconductor substrate 11, such as MOS gates formed in polysilicon underlayers 12; and can also be used to electrically isolate metal interconnect lines (typically aluminum/silicon/copper alloys) that are used to electrically connect the devices formed on the substrate (not shown).

In the etching process, a layer of photoresist is applied on the dielectric layer 10, and the photoresist layer is patterned using conventional photolithographic methods to form a patterned resist layer 14. Thereafter, conventional etching processes are used to etch features 15, such as contact holes or vias, through the exposed portions of the patterned resist layer 14. It is desirable for the dielectric etching process to provide etching selectivity ratios of greater than 10:1 with respect to the resist layer 14, and to provide etching uniformity across the substrate of less than 10%. The etching selectivity ratio is the ratio of the dielectric etch rate to the resist, or underlayer, etch rate. Etching uniformity is typically a statistical measure of the variation in size and depth of the etched features 15, across the substrate surface. After the etching process, the etched features 15 are filled with electrically conductive material 16 to form electrically conductive plugs or interconnects, which interconnect devices formed on the substrate, or interconnect lower levels of metal interconnect lines to upper levels of metal interconnect lines.

Modern VLSI and LSI integrated circuits often require etched features 15 having a particular predefined shape and/or cross-sectional profile. The desired shape and cross-sectional profile of the feature 15 can vary with the type of dielectric layer 14 that is etched, and the nature of subsequent deposition processes performed on the substrate 10. For example, in etching silicon dioxide glass deposited from tetraethylorthosilane (TEOS) it is often desirable to etch features 15 having an open-cup shape, as illustrated in FIG. 2b; and for etching BPSG glass, it is desirable to etch features 15 having a "wine-glass" profile, as illustrated in FIG. 2c. Both the cup and wineglass shaped profiles have a funnel-shape with a large opening that allows uniform filling of the etched feature 15 with conductive material, particularly when the conductive material is deposited by the line-of-sight deposition processes, such as sputter deposition.

The shape of the cross-sectional profile of the etched feature 15 can be quantified using different measurements, including for example, the L/V ratio and θ angle of the etched features. With reference to FIG. 1a, the L/V ratio provides a measure of the aperture and depth of the etched feature 15, where L is the length of the lateral overhang of the resist layer at the opening of the etched feature, and V is the vertical depth of the etched feature. The θ angle is a measure of the degree of "openness" of the etched feature 15, and is measured from the angle formed by the tangent to the upper sidewalls of the etched features 15 and the overhanging resist layer 14. The particular L/V ratio and θ angles that are desirable depend upon the desired cross-sectional profile of the etched feature 15, the dielectric material, and the type of deposition process that is subsequently used to deposit conductive material in the etched feature. Generally, an L/V ratio of about 1, and a θ angle of greater than about 90° is desirable for features etched in dielectric layers such as, silicon dioxide deposited from TEOS (tetraethylorthosilane) or BPSG.

In conventional reactive ion etching (RIE) processes, the dielectric layer 10 is etched using a capacitive plasma formed from process gas comprising halogen-containing gases, such as for example, $CF_4/O_2$, $CF_4/NF_3$, $NF_3/He$, and $CHF_3/CF_4/Ar$. In RIE process, process gas is introduced into a chamber containing a substrate 11, and a capacitive plasma is generated from the process gas by applying an RF bias current to parallel and spaced apart process electrodes in the chamber. The resultant electric field generated between process electrodes has field lines perpendicular to the substrate, and the plasma ions accelerate in the direction of the electric field lines to energetically impinge upon and etch the dielectric layer 10 on the substrate 11.

Conventional RIE process typically provide "anisotropic" etching of the dielectric layer 10 resulting in etched features 15 that have straight and substantially vertical sidewalls 17, as shown in FIG. 1a. Anisotropic etching occurs because the energetic plasma ions, accelerated in the direction of the perpendicular electric field lines, provide high vertical etch rates through the dielectric layer 10 and low horizontal etching rates at the sidewalls 17 of the etched features 15. However, to control the shape of the etched feature, it is necessary to obtain a certain degree of horizontal etching at the sidewalls of the etched features, to provide a more "isotropic" etching process, that results in more open cross-sectional profiles. Thus, conventional RIE etching processes typically do not provide good control over the shape of the etched features 15, particularly for open-cup and wineglass shaped profiles.

It is known to modify RIE process steps to obtain a certain degree of anisotropic etching of the substrate 15. For example, U.S. Pat. No. 4,764,245, which is incorporated herein by reference, teaches a modified RIE plasma method for etching features with sloped sidewalls in oxide layers using (i) a first isotropic etching step that uses an etching gas containing free fluorine atoms such as $CF_4$, and/or $NF_3$ mixed with oxygen; and (ii) an anisotropic etching step that uses an etching gas containing free $CF_3$ radicals and ions (such as $CF_4$), mixed with $NF_3$, and argon, helium, or nitrogen. The patent further teaches that during the isotropic etching step, the spacing of the electrodes in the chamber is increased to greater than 1 cm, and during the anisotropic step, the electrode spacing is reduced to less than 1 cm. Such multi-step RIE etching processes that use sequential isotropic and anisotropic etching steps are difficult to control, and often do not provide adequate control of the shape of the cross-sectional profile of the etched feature 15. Also, the multiple steps in the process reduce process throughput.

In another etching method, a microwave plasma or ECR source, is used to form the etching plasma by exciting the process gas using microwaves applied by a microwave applicator. Although microwave plasma processes provide superior isotropic etching characteristics; these processes often do not provide adequate control of the cross-sectional profile of the etched features. In particular, it has been observed that the profile of the etched features can vary depending upon the interaction of the microwave plasma with the different types of deposited dielectric layers, especially the silicon dioxide layers. For example, conventional microwave plasma processes for etching BPSG layers often result in etched features that have an excessively small LIV ratios and/or θ angles that are too large. In another example, microwave plasma processes used for etching silicon dioxide layers deposited from tetraethylorthosilane often result in etched features that have excessively large L/V ratios. Thus, conventional microwave plasma processes often fail to control the shape of the etched feature. Also, conventional microwave etching processes can also often result in etched features having a cusped cross-sectional profile, as for example shown in FIG. 1b. The cusped etched features typically have low LIV ratios of less than about 0.75, and often less than 0.5, and low θ angles of about 80°. The low L/V ratios and θ angles do not allow uniform filling of the etched features 15, resulting in formation of overhangs at the corners and edges of the etched features. Upon further deposition, the overhangs coalesce to form voids and gaps within the deposited material, as schematically shown in FIG. 1c, resulting in poor electrical insulation, or electrical shorting.

Accordingly, there is a need for an etching process that provides control of the shape or cross-sectional profile of the features etched in the dielectric layer, to etch features having L/V ratios close to 1, and θ angles of less than about 90°. It is further desirable for the etching process to provide high etching rates, good etching uniformity, and high etching selectivity ratio relative to photoresist.

SUMMARY

The present invention is directed to a microwave-activated plasma process for etching dielectric layers on a substrate with excellent control of the shape and cross-sectional profile of the etched features, high etch rates, and good etching uniformity. In the process, a substrate having a dielectric layer thereon, is placed in a process zone. A process gas comprising (i) fluorocarbon gas, (ii) inorganic fluorinated gas, and (iii) oxygen, is introduced into a plasma zone remote from the process zone. A microwave-activated plasma is formed from the process gas by coupling microwaves into the remote plasma zone. The microwave-activated plasma is introduced into the process zone to etch features having predefined shapes in the dielectric layer on the substrate.

The process gas composition and process conditions needed to etch features having a particular shape depend upon the composition of the dielectric layer, and the desired shape of the etched feature. It has been discovered that a process gas comprising $CF_4$, $NF_3$, and $O_2$, can be used to etch features having a hemispherical concave shape. The volumetric flow ratio of $CF_4:O_2$ is selected so that the cross-sectional profile of the etched features have (i) an average L/V ratio of from about 0.6 to about 1.4, or (ii) an average θ angle of less than about 90°. Preferably, the volumetric flow ratio of $CF_4:O_2$ is from about 0.15 to about 0.7, and the volumetric flow ratio of $CF_4:NF_3$ is from about 0.1 to about 0.7.

DRAWINGS

These and other features, aspects, and advantages of the present invention will be better understood from the following drawings, description and appended claims, which illustrate examples of the invention, where:

DESCRIPTION

Figure 1A:
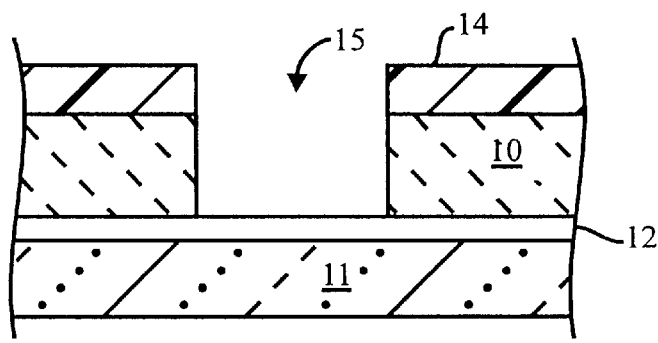
FIG. 1a (Prior Art) is a cross-sectional schematic view of a feature etched in a dielectric layer using conventional RIE etching processes, showing anisotropically etched features having substantially vertical sidewalls.
Figure 1B:
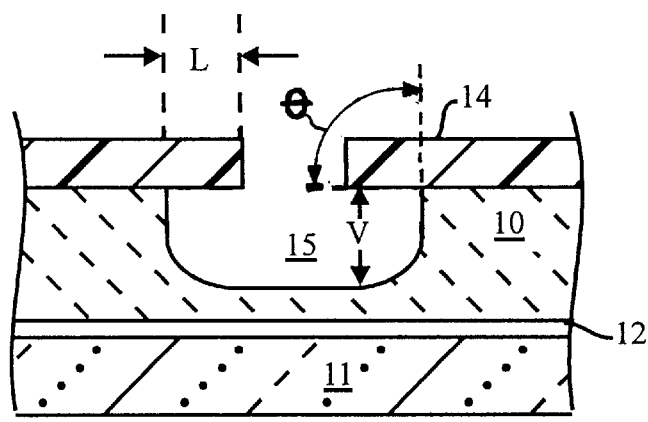
FIG. 1b (Prior Art) is a cross-sectional schematic view of a feature etched in a dielectric layer using other conventional etching processes, showing the cusped cross-sectional profile of the etched features.
Figure 1C:
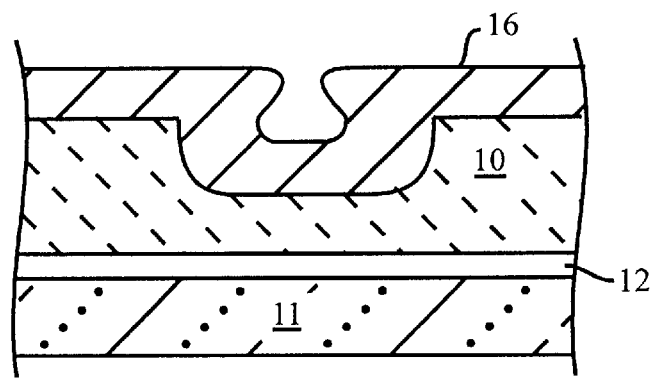
FIG. 1c (Prior Art) is a cross-sectional schematic view of the etched feature of FIG. 1 b showing accumulated deposit overhangs formed on the edges of the cusped features.
Figure 2A:
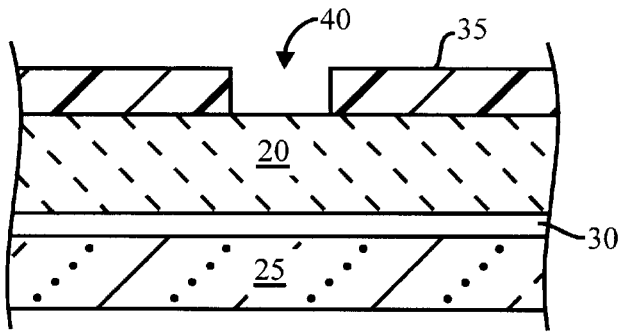
FIG. 2a is a cross-sectional schematic view of a substrate having a dielectric layer with patterned resist thereon.
Figure 2B:
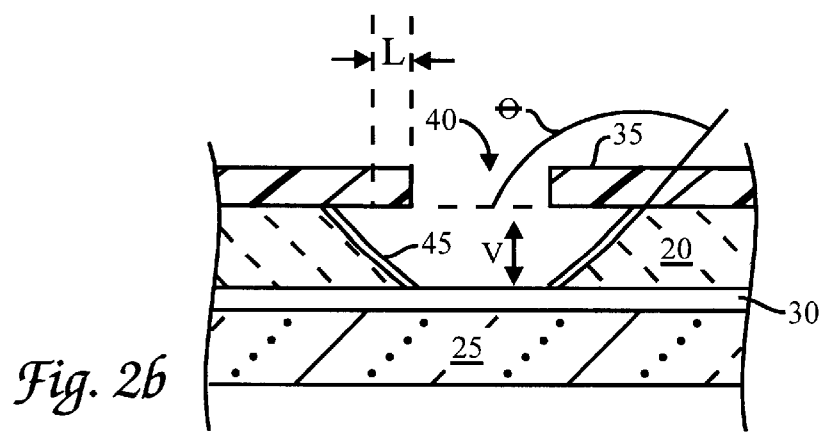
FIG. 2b shows the substrate of FIG. 2a after etching of the dielectric layer on the substrate, showing etched features having a hemispherical concave shape.
Figure 2C:
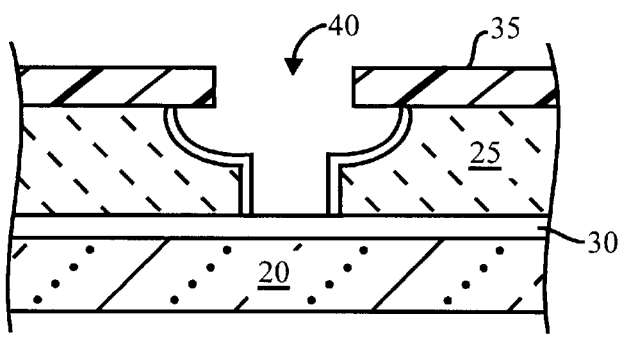
FIG. 2c shows the substrate of FIG. 2a after etching of the dielectric layer on the substrate, showing etched features having a wineglass shaped cross-sectional profile.

The etching process of the present invention is useful for etching dielectric layers 20 on a substrate 25, as illustrated in FIGS. 2a–2c, and is particularly useful for etching features having predefined shapes. The substrate 25 can be made of any material, such as glass, ceramic, metal, polymer, or semiconductor substrates, such as a silicon or gallium arsenide wafers. The dielectric layer 20 on the substrate 25 typically comprises silicon dioxide, undoped silicate glass, phophosilicate glass (PSG), borophosphosilicate glass (BPSG), silicon nitride, or combinations thereof; and typically has a thickness of about 400 to 1600 nm. For example, the dielectric layer 20 can comprise a silicon oxide layer having a thickness of about 100 to 500 nm, covered by a 300 to 800 nm BPSG layer. The dielectric layer 20 is deposited on a substrate by any conventional method. For example, a dielectric layer 20 of silicon dioxide can be deposited by chemical vapor deposition (CVD) using tetraethylorthosilane (TEOS) precursor gas.

The dielectric layer 20 is used to electrically isolate devices or interconnect lines formed on the substrate 25. For example, the dielectric layer 20 can be used to electrically isolate an underlayer 30, such as a doped, polysilicon layer, a diffusion layer, or a conductive layer such as titanium silicide, as shown in FIG. 2a. Dielectric layers 20 are also used to cover etched interconnect lines that include (i) a lower diffusion barrier layer, such as titanium, tungsten, titanium-tungsten or titanium nitride; (ii) an electrically conductive layer comprising aluminum, copper and silicon; and (iii) an anti-reflective layer, such as silicon, titanium nitride or titanium-tungsten, each of the layers being typically from about 200 nm to about 1000 nm thick.

Prior to etching, a photoresist 35, such as "RISTON," manufactured by DuPont de Nemours Chemical Company, is applied on the dielectric layer 20 to a thickness of about 0.4 to about 1.3 micron. The features 40 to be etched in the insulative dielectric layer 20, for example contact holes or vias, are defined in the resist using conventional photolithographic processes in which the resist 35 is exposed to light through a mask that has apertures corresponding to the desired configuration of features 40. During the etching process, the resist 35 can react with process gas to form polymeric byproducts that deposit as passivating deposits 45 on the bottom and sidewalls of the etched features 40. The etched features 40 are typically sized from about 0.2 to about 10 microns, and more typically about 0.4 to 2 microns, and the spacing between the features 40 is typically from 0.2 microns to 10 microns.

Figure 3:
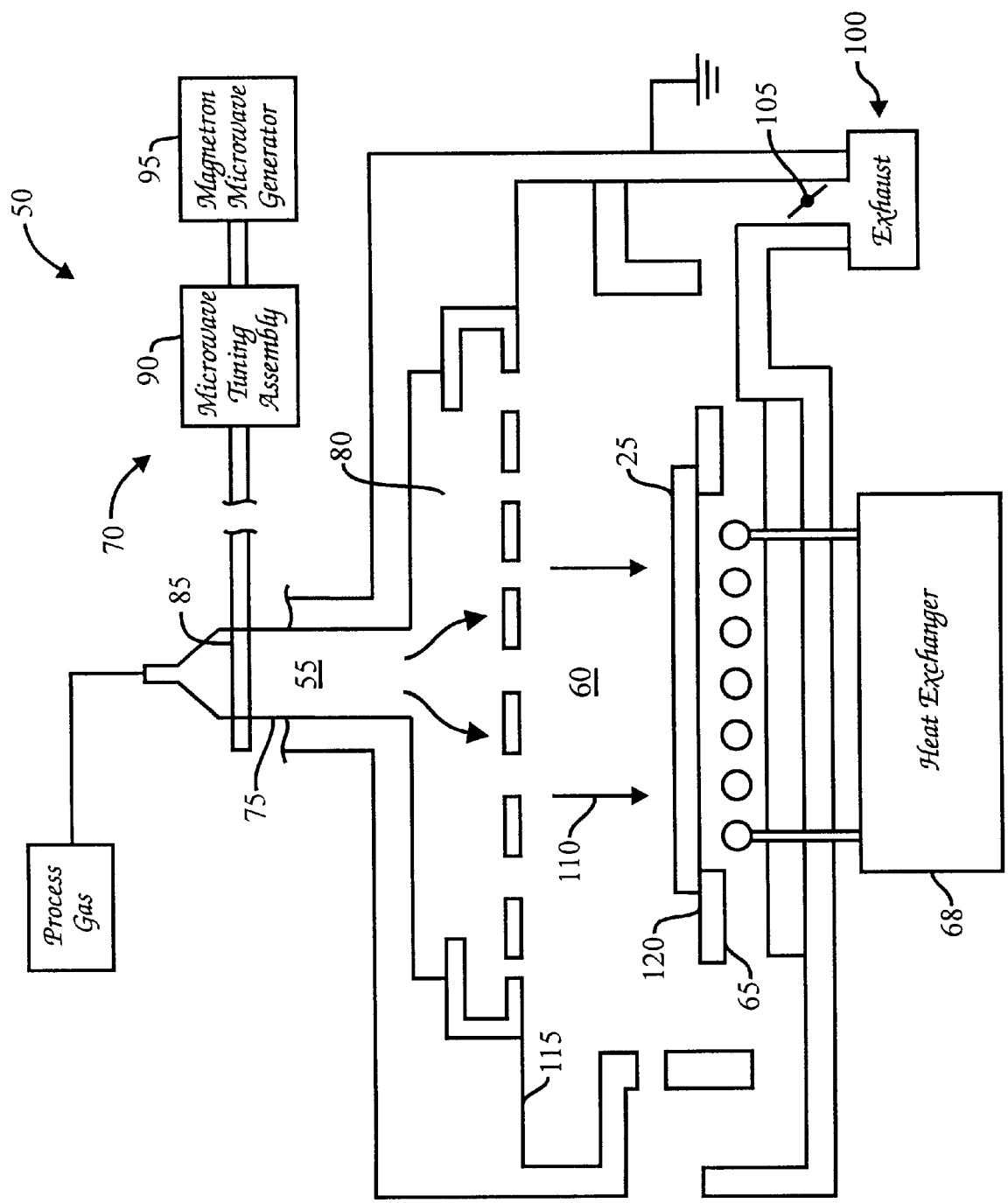
FIG. 3 is a partial cross-sectional schematic view of a process chamber suitable for practicing the process of the present invention.

The dielectric layer 20 on the substrate 25 is etched in a process chamber 50, such as for example, an "RPS" etch chamber with a microwave plasma module, commercially available from Applied Materials Inc., Santa Clara, Calif., as schematically illustrated in FIG. 3. The particular embodiment of the process chamber 50 shown herein, is suitable for processing of semiconductor substrates 25, is provided only to illustrate the invention, and should not be used to limit the scope of the invention. For example, the etching process of the present invention can be used for manufacturing processes other than semiconductor fabrication, and can be used to etch materials other than dielectric layers, such as for example, polysilicon, monocrystalline silicon, suicides, nitrides, and including $Ta_2O_5$, $TiO_2$, TiN, $WSi_x$, and $MoSi_x$.

The process chamber 50 comprises a first cavity that serves as the plasma generation zone 55, and a second cavity that serves as the process zone 60. The process zone 60 preferably comprises an enclosed cavity having a volume of at least about 5,000 $cm^3$, and more preferably from about 10,000 to about 50,000 $cm^3$. The process zone 60 includes a support 65 for holding a substrate 25, the support 65 preferably including an embedded resistive heater for heating the substrate 25. Typically, the substrate 25 is held in place on the support 65 using a mechanical or electrostatic chuck (not shown) having grooves in which a heat transfer gas, such as helium, is held to control the temperature of the substrate 25. A heat transfer fluid supplied from a heat exchanger 68, is circulated in the support 65 to further control the temperature of the substrate.

The plasma zone 55 comprises a cavity with a microwave plasma generator 70 coupled thereto for transmitting microwaves through the cavity. Preferably, a tube 75 made of a dielectric material that is nonreactive to the process gas, serves as the plasma zone, a suitable tube comprising a sapphire tube having a diameter of about 15 to 50 mm. The tube 75 is fluidly connected to a gas distributor 80 disposed in the process zone 60, so that the process gas activated by microwaves in the plasma zone can flow through the tube 75 and into the process zone 60. The microwave generator 70 coupled to the plasma zone, can comprise any conventional microwave generator, such as for example, microwave plasma generators commercially available from Daihen Corporation, Japan. Typically, the microwave generator 70 comprises a microwave applicator 85, microwave tuning assembly 90, and magnetron microwave generator 95. The microwave applicator 85 comprises a shorted waveguide positioned in the tube 75, and in the path of the process gas flowing therethrough. The microwave tuning assembly 90 tunes the microwave applicator 85 to match the impedance of the load in the plasma zone 55, which typically changes with varying process gas flow rates, pressure, and also changes during the etching process. Impedance matching is typically performed by measuring the forward and reflected power in the plasma zone 55, (i) by a directional coupler (not shown) positioned adjacent to the microwave applicator 85, and (ii) by adjusting tuning stubs in a separate tuning module (not shown) disposed between the directional coupler and the microwave applicator 85 to minimize reflected power. Preferably the plasma zone cavity 55 is shaped and sized to provide a low Q, waveguide resonant cavity to allow matching of load impedance over a broad range of loads. Optionally, an ignition source, such as a Tesla coil that provides a high voltage spark, can be used to reliably ignite a plasma in the plasma zone 55. The microwave generator 70 is typically operated at a power level of about 200 to about 3000 Watts, and at a frequency ranging from about 800 MHz to about 3000 MHz.

Preferably, the plasma zone 55 is remote from the process zone 60 to provide more control over the chemical reactivity of the microwave activated plasma formed in the plasma zone. By remote it is meant that the plasma zone 55 is distal from the process zone, and preferably comprises a cavity located at a distance of at least about 50 mm, and more preferably from about 100 to 600 mm, upstream from the process zone 60. The shape, size, and distance of the remote plasma zone 55, all affect the chemical reactivity and nature of the plasma species etching the substrate. For example, a more distant plasma zone increases the recombination of highly reactive dissociated plasma species into less reactive non-dissociated species, during transport of the plasma species from the remote plasma zone to the surface of the substrate 20, resulting in slower and more controlled etch rates. It is also believed that the ratio of the dissociated to non-dissociated species in the plasma can affect the shape of the etched feature 40. Furthermore, increased plasma dissociation provides a "softer" more chemically reactive etching process that results in increased isotropic etching. Thus, preferably, the plasma zone 55 comprises a second cavity spaced apart and remote from the process zone 60.

Spent process gas and etchant byproducts are exhausted from the process chamber 50 through an exhaust system 100 capable of achieving a minimum pressure of about 1 mTorr in the process chamber 50. A throttle valve 105 is provided in the exhaust 100 for controlling the pressure in the chamber 50.

The microwave-activated plasma of the process gas of the present invention provides a "softer" isotropic etching process with excellent control of the shape and cross-sectional profile of features 40 etched in the dielectric layer 20, and more controllable etch rates. The plasma is formed in a plasma zone 55 remote from the process zone 60, using process gas comprising (i) fluorocarbon gas for providing fluoride-containing dissociated species that etch the dielectric layer 20, (ii) inorganic fluorinated gas, that enhances dissociation of the flurocarbon gas, and/or reduces the recombination of dissociated fluorine-containing species during transport of the plasma, and (iii) $O_2$ for controlling the amount of passivating deposits 45 formed on the substrate 25. The function of these gases and preferred volumetric flow ratios will now be described.

The fluorocarbon gas forms dissociated fluorine-containing etching species when activated by microwaves. Suitable fluorocarbon gases that contain carbon, fluorine, and optionally hydrogen, include for example, $CF_4$, $C_2F_6$, $C_3F_8$, $C_4F_8$, $C_4F_{10}$, $CHF_3$, $CH_3F$, $C_2HF_5$, $CH_2F_2$, $C_3H_2F_6$, $C_2H_4F_6$, and mixtures thereof. Although the gas chemistry is not fully understood, it is believed that the fluorocarbon gas dissociates upon activation by microwaves to form a variety of fragments, including atomic fluorine species. The atomic fluorine species are highly reactive and etch silicon-containing dielectric layers 20 to form volatile $SiF_x$ species that are exhausted from the chamber 50.

The process gas also comprises inorganic fluorinated gas, such as for example, $NF_3$, $SF_6$, HF, and mixtures thereof. By inorganic fluorinated gas it is meant a fluoride gas that is absent carbon. Preferably, the inorganic fluorinated gas consists of $NF_3$, which dissociates in a microwave-activated plasma with relatively high dissociation rates. The highly dissociated $NF_3$ gas allows an increased number of dissociated species to reach the substrate 20. This is particularly important in remote plasma processes, where frequent collisions of the dissociated fluorine-containing species during transport of the plasma from the remote plasma zone 55 to the process zone 60, can result in recombination of dissociated atomic fluorine species into less reactive non-dissociated species, such as $F_2$. The resultant loss of dissociated fluorine-containing species provides slower dielectric etching rates and reduced isotropic etching. Use of the highly dissociative $NF_3$ gas, provides an increased amount of dissociated fluorine-containing species in the plasma that reduce the effect of recombination of some of the dissociated species during transport from the remote plasma zone 55 to the process zone 60.

Preferably, the fluorocarbon gas comprises $CF_4$, which has moderate to low dissociation rates in a microwave activated environment, and the inorganic fluorinated gas comprises $NF_3$, which is highly dissociated by microwaves. When $CF_4$ gas is used in conjunction with the more dissociative $NF_3$ gas, the less dissociated $CF_4$ gas serves as a diluent gas that provides more control of the etching characteristics of the process gas mixture, and in particular more control of the shape of the features etched in the dielectric layer 20. Preferred volumetric flow ratios of inorganic fluorinated:fluorocarbon gas are from about 0.1 to about 0.7, and more preferably from 0.15 to 0.5.

The oxygen gas is provided to reduce the amount of free carbon available to form passivating deposits 45 by reacting with free carbon species to form CO and $CO_2$ gas that is exhausted from the process zone 60. During most typical etching processes, free carbon species in the process gas, and vaporized polymeric resist species react to form polymeric byproducts that deposit as passivating deposits 45 on the bottom and sidewalls of the etched features 40. It is believed that reduction of the free carbon content of the process gas by the addition of oxygen, limits or eliminates entirely the deposition of passivating deposits 45 on the etched features 40, to provide highly isotropic etching of the substrate. The oxygen gas can also enhance etch rates by forming CO gas that reacts with the oxygen of silicon dioxide dielectric layers.

The volumetric flow ratio of oxygen:fluorocarbon significantly affects the amount of available free carbon in the process zone, which it is believed affects the degree of isotropic etching, and shape of the etched feature. Thus, preferably, the volumetric flow ratio of oxygen:fluorocarbon is selected so that the features etched in the dielectric layer have an average L/V ratio of from about 0.6 to about 1.4, and an average θ angle of less than about 90°. Suitable volumetric flow ratios of oxygen:fluorocarbon that provide excellent control over the shape of the etched features, and high etch rates, are from about 0.15 to about 0.7, and more preferably from 0.18 to 0.65.

Preferred gas composition and volumetric flow ratios depend upon the type of dielectric material, and the desired shape or profile of the etched features 40, including their aspect ratios, L/V ratios, and θ profile angles. The process of the present invention provides control over the shape and cross-sectional profile of the etched feature, by providing control over the ratio of the anisotropic and isotropic etching rates of the substrate. For example, if the shape of the predefined feature comprises a wide diameter, the isotropic etching rate is increased (for example, by increasing the $NF_3$ content of the gas) to provide more lateral/horizontal etching of the substrate. In contrast, if the shape of the predefined feature is shallow and deep, the amount of CO can be increased to provide increased isotropic etching of the substrate. Thus, the volumetric flow ratio of oxygen: fluorocarbon gas (preferably $O_2$ and $CF_4$), and the volumetric flow ratio of inorganic fluorinated:fluorocarbon gas (preferably $CF_4$ and $NF_3$), are the primary factors in controlling the shape and cross-sectional profile of the etched features, and preferred flow ratios are selected primarily to etch features 40 having a hemispherical concave shape, as shown in FIGS. 2b–2c.

Although preferred volumetric flow ratios are recited herein, it should be understood that the volumetric flow ratios can be tailored for different materials, and different predefined etching shapes. For example, when etching a feature having a predefined hemispherical concave profile (as shown in FIG. 2b) in a layer of silicon dioxide deposited using TEOS, the volumetric flow ratio of inorganic fluorinated:fluorocarbon gas is preferably from about 0.2 to about 0.5,; and of oxygen:fluorocarbon is preferably from about 0.18 to about 0.32. As another example, when etching feature having a predefined wineglass shaped profile (as shown in FIG. 2c) in BPSG glass, a preferred volumetric flow ratio of inorganic fluorinated:fluorocarbon gas is from about 0.15 to about 0.32; and of oxygen:fluorocarbon is from about 0.45 to about 0.65.

As described above, preferably, the process gas comprises $CF_4$, $NF_3$, and $O_2$. For the volume of the process zone 60 described herein, suitable flow rates of (i) $CF_4$ range from about 200 to about 1400 sccm, and more preferably from about 300 to about 1200 sccm; (ii) $NF_3$ range from about 30 to about 600 sccm, and more preferably from about 50 to about 400 sccm; and (iii) $O_2$ range from about 60 to about 600 sccm, and more preferably from about 70 to about 500 sccm. Because actual flow rates are dependent upon the volume of the chamber 50, the invention should not be limited to the flow rates recited herein, and equivalent flow rates for different sized process zones 60 are within the scope of the present invention.

The process gas is activated by microwaves to form a microwave-activated plasma. Typically, the microwave plasma generator 70 is operated at a power level of from 200 to 3000 Watts, and more preferably from 500 to 2000 Watts. The activated process gas is introduced into the process zone 60, and during the etching process, the pressure in the process zone 60 is typically maintained at from about 500 to about 4000 mTorr, and more typically from 1000 to 3000 mTorr, by controlling the opening of the throttle valve 105.

During the etching process, the substrate is maintained at a temperature of about 20 to 120° C., and more preferably from 40 to 100° C. The temperature of the substrate also significantly affects the shape of the etched features 40. Low temperatures have been observed to produce lower L/V ratios on certain undoped oxides; whereas, high temperatures produce high L/V ratios on the same oxides.

The etching process of the present invention provided high dielectric etch rates of about 300 to 700 nm/min. In addition, etching uniformity of less than about 10%, and more typically less than about 5%, was obtained. More importantly, the present etching process provided excellent control of the shape and cross-sectional profile of etched features 40. For example, L/V ratios ranging from about 0.6 to about 1.4, and θ angle values of typically less than 90°, were obtained. The microwave-activated plasma of the fluorocarbon, inorganic fluorinated gas, and oxygen gas, provides excellent control of the shape and profile geometry of the etched features 40, due to the ability to control the chemical reactivity of the dissociated species in the process gas. Conventional etching processes do not always allow control of the amount of dissociated species, or free carbon, in the process. Also, conventional RIE etching methods maintain the substrate 25 at an electric potential that causes plasma species to accelerate toward the substrate 25, and etch the substrate 25 in a combined etching and sputter bombardment mechanism. In contrast, the microwave-activated plasma process provides increased isotropic etching due to the higher reactivity and lower bombardment energy of the microwave plasma species. For these reasons, the microwave-activated plasma process of the present invention provides significant advantages over the prior art.

EXAMPLES

The following examples illustrate use of the present invention for etching dielectric layers 20 on semiconductor substrates 25. However, the apparatus and method can be used in other applications as would be apparent to those skilled in the art, and the scope of the present invention should not be limited to the illustrative examples provided herein.

In these examples, the substrates 25 comprised silicon wafers with a diameter of 200 mm (8 inch). Each substrate 25 was placed on the support 65 of an evacuated RPS process chamber 50. Process gas having the particular gas compositions described below, was introduced into the microwave plasma zone 55, and a plasma was formed from the process gas using the microwave plasma generator 70. The plasma was introduced into the process zone 60 to etch the dielectric layer 20 on the substrate 25.

The substrate 25 was maintained at the desired temperatures by supplying a flow of helium gas on the backside of the substrate 25 at a pressure of 4 Torr for examples 1–8, and 8 Torr for examples 9–16. Also, the chamber wall was heated to a temperature of 65° C. to reduce deposit formation on the wall. The etching process was performed for a sufficient time to etch to the desired depth through the dielectric layers 20 on the substrate 25.

SEM photos of the etched wafers were used to measure the (i) dielectric etch rate, (ii) etch rate uniformity, and (iii) the L/V ratios for the etched features 40, and (iv) the angle θ of the features 40. Etch rates were calculated by measuring the depth of the features 40 etched in the wafers. The etch rate uniformity was calculated at different measured points, using the formula:

$$\text{Uniformity} = \frac{\text{standard deviation of etch rates}}{\text{mean etch rate}} \times 100\%$$

The L/V ratio was measured using the length L and depth V of the etched features 40. The angle θ was measured as the angle observed between the overhanging resist layer 35 and the tangent to the upper portion of the sidewall of the etched features 40.

EXAMPLES 1–16

In these examples, a dielectric layer 20 of silicon dioxide deposited by chemical vapor deposition using tetraethylorthosilane (TEOS) precursor gas, was etched at high etch rates, and with good L/V ratios and θ angles. In these examples, each of the substrates 25 comprised (i) a lower polysilicon layer, (ii) a middle layer of $TiS_x$ having a thickness of 0.5 microns, and (iii) an upper dielectric layer 20 of silicon dioxide deposited from TEOS precursor.

In the examples provided below, a factorial design study comprising a $2^{7-3}$ orthogonal matrix was used, a list of the process variables and the selected values for the process variable being provided in Table I.

The process conditions used in these examples are listed in Table II. Excellent control of the cross-sectional profile of the etched features 40 was obtained with the L/V ratios ranging from about 1.07 to about 1.58, and the θ angles ranging from about 50 to 85. The experiments of Examples 5, 9, and 13 were each repeated to obtain repeatable results. The best results were obtained for Example 2, which provided an etch rate of about 783 Å/min, and L/V ratio of 1.26, a θ angle of 79°, and an etch rate uniformity of 1.31%. In this example, the process gas mixture had a $NF_3/CF_4$ ratio of 0.5, and an $O_2/CF_4$ ratio of about 0.32. The total flow rate of the process gas was about 1500 sccm.

TABLE I

ORTHOGONAL MATRIX PROCESS CONDITIONS FOR EXAMPLES 1 to 16

| FACTORS | LEVEL | |
|---|---|---|
| | I | II |
| $NF_3/CF_4$ ratio | 0.2 | 0.5 |
| $O_2/CF_4$ ratio | 0.18 | 0.32 |
| Total Flow (sccm) | 700 | 1500 |
| Pressure (mTorr) | 1000 | 3000 |
| Temperature °C. | 40 | 100 |
| Power (Watts) | 900 | 1400 |
| Helium Pressure (mTorr) | 4 | 10 |

TABLE II

PROCESS CONDITIONS FOR EXAMPLES 1–16

| EXAMPLE # | $NF_3/CF_4$ RATIO | $O_2/CF_4$ RATIO | $CF_4$ FLOW sccm | $NF_3$ FLOW sccm | $O_2$ FLOW sccm | TOTAL FLOW sccm | PRESSURE mTorr | CHUCK TEMPERATURE (°) |
|---|---|---|---|---|---|---|---|---|
| 1 | 0.2 | 0.18 | 507 | 101 | 91 | 700 | 1000 | 40 |
| 2 | 0.5 | 0.32 | 824 | 412 | 264 | 1500 | 1000 | 40 |
| 3 | 0.2 | 0.18 | 1087 | 217 | 196 | 1500 | 3000 | 40 |
| 4 | 0.5 | 0.32 | 385 | 192 | 123 | 700 | 3000 | 40 |
| 5 | 0.2 | 0.32 | 461 | 92 | 147 | 700 | 3000 | 100 |
| 6 | 0.5 | 0.18 | 893 | 446 | 161 | 1500 | 3000 | 100 |

TABLE II-continued

PROCESS CONDITIONS FOR EXAMPLES 1–16

| | | | | | | | | |
|---|---|---|---|---|---|---|---|---|
| 7 | 0.2 | 0.32 | 987 | 197 | 316 | 1500 | 1000 | 100 |
| 8 | 0.5 | 0.18 | 471 | 208 | 75 | 700 | 1000 | 100 |
| 9 | 0.2 | 0.32 | 987 | 197 | 316 | 1500 | 3000 | 40 |
| 10 | 0.5 | 0.18 | 417 | 208 | 75 | 700 | 3000 | 40 |
| 11 | 0.2 | 0.32 | 461 | 92 | 147 | 700 | 1000 | 40 |
| 12 | 0.5 | 0.18 | 893 | 446 | 161 | 1500 | 1000 | 40 |
| 13 | 0.2 | 0.18 | 1087 | 217 | 196 | 1500 | 1000 | 100 |
| 14 | 0.5 | 0.32 | 385 | 192 | 123 | 700 | 1000 | 100 |
| 15 | 0.2 | 0.18 | 507 | 101 | 91 | 700 | 3000 | 100 |
| 16 | 0.5 | 0.32 | 824 | 412 | 264 | 1500 | 3000 | 100 |
| AVERAGE | | | | | | | | |

| EXAMPLE # | POWER watts | HELIUM PRESSURE mTorr | ETCH RATE nm/min | ETCH UNIFORMITY (%) | L/V RATIO | ANGLE θ |
|---|---|---|---|---|---|---|
| 1 | 900 | 4 | 70 | 1.71 | 1.32 | 83 |
| 2 | 900 | 4 | 78 | 1.31 | 1.26 | 79 |
| 3 | 1400 | 4 | 132 | 1.06 | 1.43 | 75 |
| 4 | 1400 | 4 | 116 | 1.20 | 1.35 | 85 |
| 5 | 900 | 4 | 114 | 3.26 | 1.25 | 57 |
| 6 | 900 | 4 | 218 | 1.07 | 1.58 | 51 |
| 7 | 1400 | 4 | 183 | 1.90 | 1.50 | 52 |
| 8 | 1400 | 4 | 193 | 1.78 | 1.55 | 55 |
| 9 | 900 | 10 | 107 | 4.98 | 1.07 | 60 |
| 10 | 900 | 10 | 94 | 1.06 | 1.56 | 72 |
| 11 | 1400 | 10 | 81 | 1.74 | 1.37 | 2 |
| 12 | 1400 | 10 | 86 | 2.12 | 1.39 | 82 |
| 13 | 900 | 10 | 135 | 1.30 | 1.54 | 53 |
| 14 | 900 | 10 | 190 | 1.67 | 1.44 | 52 |
| 15 | 1400 | 10 | 207 | 1.40 | 1.54 | 50 |
| 16 | 1400 | 10 | 336 | 1.20 | 1.47 | 54 |
| AVERAGE | | | 147 | 1.80 | 1.41 | 65 |

EXAMPLES 17–32

In these examples, a dielectric layer 20 comprising BPSG glass was etched at high etch rates and with excellent control of the shape and cross-sectional profile of the etched feature. In these examples, the substrates 25 comprised a lower polysilicon layer, a middle layer of $TiS_x$ having a thickness of 0.5 microns, and an upper BPSG layer having a thickness of about 1.5 microns.

In the examples provided below, a factorial design study comprising a $2^{7-3}$ orthogonal matrix was used, as shown in Table III.

TABLE III

ORTHOGONAL MATRIX PROCESS CONDITIONS FOR EXAMPLES 17-32

| | LEVEL | |
|---|---|---|
| FACTORS | I | II |
| $NF_3/CF_4$ ratio | 0.15 | 0.32 |
| $O_2/CF_4$ ratio | 0.45 | 0.65 |
| Total Flow (sccm) | 700 | 1500 |
| Pressure (mTorr) | 1000 | 3000 |
| Temperature °C. | 40 | 100 |
| Power (Watts) | 900 | 1400 |
| Helium Pressure (mTorr) | 4 | 10 |

Table IV shows the process conditions of examples 17–32 and the results obtained therefrom. Example 24 provided excellent results, with an etch rate of 783 Å/min, L/V ratio of 1.26, a θ angle of 79, and an etch rate uniformity of 1.31%. In this example, the process gas comprised a $NF_3/CF_4$ ratio of 0.5,1 and an $O_2/CF_4$ ratio of about 0.32, the total flow rate of the gas being about 1500 sccm. Example 19 provided the largest L/V ratio of 1.04; while Example 32 provided the smallest L/V ratio of 0.64.

TABLE IV

PRCOESS CONDITIONS FOR EXAMPLES 17–32

| EXAMPLE # | $NF_3/CF_4$ RATIO | $O_2/CF_4$ RATIO | $CF_4$ FLOW sccm | $NF_3$ FLOW sccm | $O_2$ FLOW sccm | TOTAL FLOW sccm | PRESSURE mTorr | CHUCK TEMPERATURE (°) |
|---|---|---|---|---|---|---|---|---|
| 17 | 0.15 | 0.45 | 438 | 66 | 197 | 700 | 1000 | 40 |
| 18 | 0.32 | 0.65 | 761 | 244 | 495 | 1500 | 1000 | 40 |
| 19 | 0.15 | 0.45 | 938 | 141 | 422 | 1500 | 3000 | 40 |
| 20 | 0.32 | 0.65 | 355 | 114 | 231 | 700 | 3000 | 40 |
| 21 | 0.15 | 0.65 | 389 | 58 | 253 | 700 | 3000 | 100 |
| 22 | 0.32 | 0.45 | 847 | 271 | 381 | 1500 | 3000 | 100 |
| 23 | 0.15 | 0.65 | 833 | 125 | 542 | 1500 | 1000 | 100 |
| 24 | 0.32 | 0.45 | 395 | 127 | 178 | 700 | 1000 | 100 |
| 25 | 0.15 | 0.65 | 833 | 125 | 542 | 1500 | 3000 | 40 |
| 26 | 0.32 | 0.45 | 395 | 127 | 178 | 700 | 3000 | 40 |
| 27 | 0.15 | 0.65 | 389 | 58 | 253 | 700 | 1000 | 40 |
| 28 | 0.32 | 0.45 | 847 | 271 | 381 | 1500 | 1000 | 40 |
| 29 | 0.15 | 0.45 | 938 | 141 | 422 | 1500 | 1000 | 100 |
| 30 | 0.32 | 0.65 | 355 | 114 | 231 | 700 | 1000 | 100 |
| 31 | 0.15 | 0.45 | 438 | 66 | 197 | 700 | 3000 | 100 |
| 32 | 0.32 | 0.65 | 761 | 244 | 495 | 1500 | 3000 | 100 |
| MEAN | | | | | | | | |

| EXAMPLE # | POWER watts | HELIUM PRESSURE mTorr | ETCH RATE nm/min | ETCH UNIFORMITY (%) | L/V RATIO | ANGLE θ |
|---|---|---|---|---|---|---|
| 17 | 900 | 4 | 305 | 0.7 | 1.01 | 102 |
| 18 | 900 | 4 | 195 | 1.7 | 0.87 | 115 |
| 19 | 1400 | 4 | 131 | 6.1 | 1.04 | 120 |
| 20 | 1400 | 4 | 151 | 3.8 | 0.96 | 109 |
| 21 | 900 | 4 | 159 | 7.7 | 0.65 | 122 |
| 22 | 900 | 4 | 565 | 2.2 | 0.73 | 109 |
| 23 | 1400 | 4 | 629 | 0.5 | 0.76 | 108 |
| 24 | 1400 | 4 | 697 | 1 | 0.96 | 99 |
| 25 | 900 | 10 | 204 | 4.7 | 0.76 | 124 |
| 26 | 900 | 10 | 88 | 4.8 | 1.02 | 120 |
| 27 | 1400 | 10 | 324 | 0.9 | 0.96 | 112 |
| 28 | 1400 | 10 | 420 | 0.7 | 0.97 | 110 |
| 29 | 900 | 10 | 565 | 0.5 | 0.80 | 106 |
| 30 | 900 | 10 | 610 | 0.6 | 0.85 | 104 |
| 31 | 1400 | 10 | 522 | 3.3 | 0.93 | 102 |
| 32 | 1400 | 10 | 649 | 2.5 | 0.64 | 105 |
| MEAN | | | 388 | 2.61 | 0.87 | 110 |

Although the present invention has been described in considerable detail with regard to the preferred versions thereof, other versions are possible. For example, gases equivalent in function to the fluorocarbon, inorganic fluorinated gas, or oxygen can also be used. Furthermore, the etching process can be used to etch materials other than dielectric materials, such as for example silicides, borides, nitrides, and carbides. Therefore, the appended claims should not be limited to the description of the preferred versions contained herein.

What is claimed is:

1. A method of etching a dielectric layer on a substrate, the method comprising the steps of:
   (a) placing the substrate having the dielectric layer, in a process zone;
   (b) introducing into a remote zone that is remote from the process zone, a process gas comprising (i) fluorocarbon gas, (ii) inorganic fluorinated gas, and (iii) $O_2$;
   (c) forming microwave-activated species from the process gas by coupling microwaves into the remote zone; and
   (d) introducing the microwave-activated species into the process zone to etch the dielectric layer on the substrate.

2. The method of claim 1, wherein the volumetric flow rates of fluorocarbon gas, inorganic fluorinated gas, and $O_2$, are selected to provide etched features having a substantially concave shape.

3. The method of claim 1, wherein the fluorocarbon gas is selected from the group consisting of $CF_4$, $C_2F_6$, $C_3F_8$, $C_4F_8$, $C_4F_1O$, $CHF_3$, $CH_3F$, $C_2HF_5$, $CH_2F_2$, $C_3H_2F_6$, $C_2H_4F_6$, and mixtures thereof.

4. The method of claim 1, wherein the inorganic fluorinated gas is selected from the group consisting of $NF_3$, $SF_6$, HF, and mixtures thereof.

5. The method of claim 1, wherein the fluorocarbon gas comprises $CF_4$, and the inorganic fluorinated gas comprises $NF_3$.

6. The method of claim 5, wherein the fluorocarbon gas consists essentially of $CF_4$, and the inorganic fluorinated gas consists essentially of $NF_3$.

7. The method of claim 5, wherein the volumetric flow ratio of $CF_4:O_2$ is selected so that features etched in the dielectric layer have an average L/V ratio of from about 0.6 to about 1.4, and have an average θ angle of less than about 90°.

8. The method of claim 5, wherein the volumetric flow ratio of $CF_4:NF_3$ is selected so that the dielectric layer is etched at (i) a dielectric etch rate of at least about 300 nm/min, and (ii) a dielectric etching uniformity of at least about 10%.

9. The method of claim 5, wherein the volumetric flow ratio of $CF_4:O_2$ is from about 0.15 to about 0.7.

10. The method of claim 5, wherein the volumetric flow ratio of $CF_4:NF_3$ is from about 0.1 to about 0.7.

11. The method of claim 1, wherein in step (c), microwaves are coupled into the remote zone using a microwave generator operated at a power level of from about 200 to about 3000 Watts.

12. The method of claim 1, wherein in step (d), the substrate is maintained at a temperature of from about 20 to about 120° C.

13. The method of claim 1, wherein in step (d), the process zone is maintained at a pressure of from about 500 to about 4000 mTorr.

14. The method of claim 1, wherein in step (b), the total flow of process gas into the remote zone is from about 500 to about 2000 sccm.

15. The method of claim 1, wherein the substrate is etched using a process chamber comprising (i) a first cavity that serves as the remote zone, and (ii) a second cavity that serves as the process zone, the first and second cavities being connected to one another to allow the passage of process gas therethrough.

16. The method of claim 1, wherein the dielectric layer is selected from the group consisting of silicon dioxide, silicate glass, phosphosilicate glass, borophosphosilicate glass, silicon nitride, or combinations thereof.

17. The method of claim 16, wherein the dielectric layer comprises silicon dioxide deposited from tetraethylorthosilane.

18. A method of etching a dielectric layer on a substrate, the method comprising the steps of:

(a) placing the substrate having the dielectric layer, in a process zone;

(b) introducing a process gas comprising $CF_4$, $NF_3$, and $O_2$, into a remote zone that is remote from the process zone;

(c) forming microwave-activated species from the process gas by coupling microwaves into the remote zone; and (d) introducing the microwave-activated species into the process zone to etch the dielectric layer on the substrate.

19. The method of claim 18, wherein the volumetric flow ratio of $CF_4:O_2$ is selected to etch in the dielectric layer etched features having a cross-sectional profile with at least one of the following characteristics:

(i) an average L/V ratio of from about 0.6 to about 1.4; or (ii) an average θ angle of less than about 90°.

20. The method of claim 18, wherein the process gas consists essentially of $CF_4$, $NF_3$, and $O_2$.

21. The method of claim 18, wherein the volumetric flow ratio of $CF_4:O_2$ is from about 0.15 to about 0.7.

22. The method of claim 18, wherein the volumetric flow ratio of $CF_4:NF_3$ is from about 0.1 to about 0.7.

23. The method of claim 18, wherein in step (c), microwaves are coupled into the remote zone using a microwave generator operated at a power output level of from about 200 to about 3000 Watts.

24. The method of claim 18, wherein in step (d), the substrate is maintained at a temperature of from about 20 to about 120° C.

25. The method of claim 18, wherein in step (d), the process zone is maintained at a pressure of from about 500 to about 4000 mTorr.

26. The method of claim 18, wherein in step (a), the dielectric layer is selected from the group consisting of silicon dioxide, silicate glass, phosphosilicate glass, borophosphosilicate glass, silicon nitride, or combinations thereof.

27. The method of claim 26, wherein in step (a), the dielectric layer is silicon dioxide deposited from tetraethylorthosilane.

28. A method of processing a dielectric layer on a substrate, the method comprising the steps of:

(a) depositing a dielectric layer on a substrate, the dielectric layer composed of silicon dioxide, silicate glass, phosphosilicate glass, borophosphosilicate glass, silicon nitride, or combinations thereof;

(b) forming a patterned photoresist layer on the dielectric layer;

(c) placing the substrate in a process zone;

(d) introducing into a remote zone, a process gas comprising (i) fluorocarbon gas, (ii) inorganic fluorinated gas, and (iii) $O_2$;

(e) forming microwave-activated species from the process gas by coupling microwaves into the remote zone; and (f) introducing the microwave-activated species into the process zone to etch the dielectric layer on the substrate.

29. The method of claim 28, wherein the fluorocarbon gas is selected from the group consisting of $CF_4$, $C_2F_6$, $C_3F_8$, $C_4F_8$, $C_4F_{10}$, $CHF_3$, $CH_3F$, $C_2HF_5$, $CH_2F_2$, $C_3H_2F_6$, $C_2H_4F_6$, and mixtures thereof.

30. The method of claim 28, wherein the inorganic fluorinated gas is selected from the group consisting of $NF_3$, $SF_6$, HF, and mixtures thereof.

31. The method of claim 28, wherein in step (d), the process gas consists essentially of $CF_4$, $NF_3$, and $O_2$.

32. The method of claim 31, wherein the volumetric flow ratio of $CF_4:O_2$ is selected so that features etched in the dielectric layer have an average L/V ratio of from about 0.6 to about 1.4, and have an average θ angle of less than about 90°.

33. The method of claim 31, wherein in step (d), the volumetric flow ratio of $CF_4:O_2$ is from about 0.15 to about 0.7.

34. The method of claim 31, wherein in step (d), the volumetric flow ratio of $CF_4:NF_3$ is from about 0.1 to about 0.7.

35. The method of claim 28, wherein in step (e), microwaves are coupled into the remote zone by a microwave generator operated at a power output level of from about 200 to about 3000 Watts.

36. The method of claim 28, wherein in step (f), the substrate is maintained at a temperature of from about 20 to about 120° C.

37. The method of claim 28, wherein in step (f), the process zone is maintained at a pressure of from about 500 to 4000 about mTorr.

* * * * *